United States Patent
Hiramoto et al.

(10) Patent No.: US 6,680,831 B2
(45) Date of Patent: Jan. 20, 2004

(54) MAGNETORESISTIVE ELEMENT, METHOD FOR MANUFACTURING THE SAME, AND METHOD FOR FORMING A COMPOUND MAGNETIC THIN FILM

(75) Inventors: Masayoshi Hiramoto, Nara (JP); Hiroshi Sakakima, Kyoto (JP); Hideaki Adachi, Osaka (JP); Nozomu Matukawa, Nara (JP); Kenji Iijima, Kyoto (JP); Mitsuo Satomi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 252 days.

(21) Appl. No.: 09/948,175

(22) Filed: Sep. 6, 2001

(65) Prior Publication Data

US 2002/0177013 A1 Nov. 28, 2002

(30) Foreign Application Priority Data

Sep. 11, 2000 (JP) ........................................ 2000-274619

(51) Int. Cl.$^7$ ................................................. G11B 5/39
(52) U.S. Cl. ................................................. 360/324.11
(58) Field of Search .................... 360/324.1, 324.11, 360/324.12, 324.2; 428/692

(56) References Cited

U.S. PATENT DOCUMENTS

| | | | |
|---|---|---|---|
| 5,695,864 A | * 12/1997 | Slonczewski | ................ 428/212 |
| 5,841,692 A | 11/1998 | Gallagher et al. | |
| 6,185,077 B1 | * 2/2001 | Tong et al. | ............. 360/324.11 |
| 6,313,973 B1 | * 11/2001 | Fuke et al. | ............... 360/324.1 |
| 6,522,507 B1 | * 2/2003 | Horng et al. | ........... 360/324.12 |

OTHER PUBLICATIONS

Parkin et al. Journal of Applied Physics, "Exchange–biased magnetic tunnel junctions . . . ", vol. 85, No. 8, Apr. 15, 1999, pp. 5828–5833.*

"Spin–Valve–Like Ferromagnetic Tunnel Junction" (K. Kobayashi et al., The Magnetics Society of Japan, vol. 112–2, 1999, p. 11–18) with its English Abstract.

"High thermal stability tunnel juctions", (S. Cardoso et al, Journal of Applied Physics, vol .87, No. 9, 2000, p. 6058–6060.

"Spin Tunneling Junctions for Magnetic Head Application" (M. Nakada et al., The Magnetics Society of Japan, vol. 112–7, 1999, p. 43–50) with its English Abstract.

* cited by examiner

Primary Examiner—David L. Ometz
(74) Attorney, Agent, or Firm—Merchant & Gould P.C.

(57) ABSTRACT

The invention provides a magnetoresistive element in which the pinned magnetic layer includes at least one non-magnetic film and magnetic films sandwiching that non-magnetic film, and the magnetic films are coupled with one another by magnetostatic coupling via the non-magnetic film. This element has an improved thermal resistance. Furthermore, the invention provides a magnetoresistive element in which the pinned magnetic layer is as described above. The magnetic films can be coupled with one another by magnetostatic coupling or antiferromagnetic coupling generating negative magnetic coupling. In this element, the magnetic field shift is reduced. Furthermore, the invention provides a magnetoresistive element in which at least one of the magnetic layers sandwiching the intermediate layer includes an oxide ferrite having a plane orientation with a (100), (110) or (111) plane. A magnetic field is introduced in a direction of the axis of easy magnetization in the plane. This oxide can be formed by sputtering with an oxide target while applying a bias voltage to a substrate including a plane on which the oxide ferrite is to be formed so as to adjust the amount of oxygen supplied to the oxide ferrite from the target.

27 Claims, 7 Drawing Sheets

MAGNETORESISTIVE ELEMENT, METHOD FOR MANUFACTURING THE SAME, AND METHOD FOR FORMING A COMPOUND MAGNETIC THIN FILM

BACKGROUND OF THE INVENTION

1. Field of the Invention

The present invention relates to magneto-resistive elements used in reading heads of magnetic recording devices such as for optomagnetic disks, hard disks, digital data streamers (DDS), or digital VCRs, in magnetic sensors for detecting rotation speed, and in magnetic random access memory (MRAM).

2. Description of the Related Art

CPP (current perpendicular to the plane)-GMR elements are magnetoresistive elements using spin-dependent scattering between ferromagnetic layers sandwiching a conductive intermediate layer, whereas TMR elements are magnetoresistive elements using spin tunneling between ferromagnetic layers sandwiching an extremely thin insulating intermediate layer. In both elements, the current flows perpendicular to the film surfaces of the multilayer structure. In these elements, to increase the reproducibility of changes of the magnetization displacement angle, one of the ferromagnetic layers may be devised as a pinned magnetic layer on which an antiferromagnetic layer such as FeMn or IrMn is layered. Also, if a layered ferrimagnetic structure including antiferromagnetic coupling, for example Co/Ru/Co, is layered on the antiferromagnetic layer, then the pinning magnetic field of the pinned magnetic layer can be increased even further.

Half-metals in which the spin polarization is expected to be 100% by band calculation have garnered attention as ferromagnetic materials. In particular for TMR elements, the magnetic resistance change ratio is higher, the higher the spin polarization of the ferromagnetic material is.

A high thermal resistance is required when the magneto-resistive element is applied to magnetic heads, MRAM memory elements or the like. For example, if the TMR element is used for an MRAM, a thermal process at about 400° C. is performed in a semiconductor process of hydrogen sintering or a passivation process.

However, when an element having an antiferromagnetic layer is heated to at least 300° C., the spin polarization of the magnetic layers decreases due to diffusion of the Mn included in the antiferromagnetic layer, and the pinning magnetic field is decreased due to the change of the composition of the antiferromagnetic layer (see S. Cardoso et.al., J. Appl. Phys. 87, 6058(2000)). Also, in elements in which a layered ferrimagnetic structure is layered on an antiferromagnetic material, the layer structure of the layered ferrimagnetic structure is disturbed during thermal processing, so that an increase of the pinning magnetic field cannot be expected. Thus, an improvement of the thermal resistance is desired for magneto-resistive elements. An increase in the thermal resistance also is desired for CIP (current in plane)—GMR elements, in which the current flows in the film plane.

Furthermore, a high magnetic resistance change ratio still has not been attained at room temperatures with elements using half metals. In particular when forming an oxide half-metal material by sputtering with an oxide target, the oxygen amount easily deviates from the stoichiometric ratio, and it is difficult to obtain high-quality magnetic thin films. But there is a possibility that higher magnetic resistance change ratios can be obtained with magneto-resistive elements using half metals.

Furthermore, in particular in TMR elements, there is the problem that there are sometimes large non-symmetries in the response to external magnetic fields.

SUMMARY OF THE INVENTION

According to a first aspect of the present invention, a magnetoresistive element includes an intermediate layer and a pair of magnetic layers sandwiching the intermediate layer, and one of the magnetic layers is a pinned magnetic layer in which magnetization rotation with respect to an external magnetic field is harder than in the other magnetic layer. The pinned magnetic layer includes at least one non-magnetic film and magnetic films sandwiching the non-magnetic films, and the magnetic films are magnetostatically coupled to one another via the non-magnetic film.

The magnetic films are magnetized antiparallel to one another with the non-magnetic film arranged between them, and the magnetostatic energy forms a closed magnetic circuit, that is, the magnetic films are magnetostatically coupled, so that leaking magnetic fields causing magnetic field shifts in the other magnetic layer (free magnetic layer) are suppressed. Also in layered ferrimagnetic structures utilizing antiferromagnetic coupling that have been used conventionally, the magnetization directions become antiparallel. However, layered ferrimagnetic structures utilize the RKKY effect (Ruderman-Kittel-Kasuya-Yoshida effect), so that they are very sensitive to the thickness of the non-magnetic film. By contrast, when using magnetostatic coupling, the dependency on the thickness is relatively small. Furthermore, when magnetostatic coupling is used, the non-magnetic film itself can be thick. Thus, the thermal stability of the element can be improved by using magnetostatic coupling.

According to a second aspect of the present invention, a magnetoresistive element includes an intermediate layer and a pair of magnetic layers sandwiching the intermediate layer, and one of the magnetic layers is a pinned magnetic layer in which magnetization rotation with respect to an external magnetic field is harder than in the other magnetic layer. The pinned magnetic layer includes at least one non-magnetic film and magnetic films sandwiching the non-magnetic film, and the magnetic films are coupled to one another by magnetostatic or antiferromagnetic coupling via the non-magnetic film, and when the magnetic films are magnetic films that are arranged at positions m (with m being an integer of 1 or greater) from the intermediate layer, $M_m$ is an average saturation magnetization of the magnetic films m and $d_m$ is their respective average film thickness, $M_{do}$ is the sum of the products $M_m \times d_m$ of the magnetic films with odd m and $M_{de}$ is the sum of the products $M_m \times d_m$ of the magnetic films with even m, then $$0.5 < M_{de}/M_{do} < 1.$$

In this element, the magnetic films are magnetized anti-parallel by antiferromagnetic or magnetostatic coupling, with non-magnetic films disposed between them. To completely eradicate the magnetic field leaking from the pinned magnetic layer, $M_{de}/M_{do}$ should be set to 1. However, as the result of experiments explained below, it was found that in particular in TMR elements, positive magnetic coupling occurs between the pinned magnetic layer and the free magnetic layer. This coupling causes non-symmetries in the response of the magnetic resistance to external magnetic fields. In these elements, it is more advantageous to set Mde/Mdo<1, so that a leaking magnetic field canceling the positive magnetic coupling is generated (causing negative magnetic coupling), improving non-symmetries. When the leaking magnetic field is too large, non-symmetries occur on the negative coupling side, so that it is preferable to set Mde/Mdo≧0.6.

According to a third aspect of the present invention, a magnetoresistive element includes an intermediate layer and a pair of magnetic layers sandwiching the intermediate layer. At least one of the magnetic layers includes an oxide ferrite having a plane orientation with a (100), (110) or (111) plane, and a change in magnetic resistance is detected by introducing an external magnetic field in the plane. The external magnetic field is preferably introduced in a direction of the axis of easy magnetization in the plane but the oxide ferrite can be non-orientated in the plane.

Examples of oxide ferrites include MnZn ferrite, NiZn ferrite and magnetite ($Fe_3O_4$). When grown in an orientated state, oxide ferrites have a relatively high magnetic resistance change ratio in the (100), (110) or (111) plane. And when grown epitaxially, the magnetization responsiveness of the magnetic resistance changes with respect to external magnetic fields is increased by introducing an external magnetic field in the direction of the axis of easy magnetization.

Yet another aspect of the present invention provides a method that is suitable for manufacturing the elements as described above. This method is suitable for manufacturing a magnetoresistive element including an intermediate layer and a pair of magnetic layers sandwiching the intermediate layer, and at least one of the magnetic layers includes an oxide ferrite. The method includes forming the oxide ferrite by sputtering with an oxide target while applying a bias voltage to a substrate including a plane on which the oxide ferrite is to be formed so as to adjust an amount of oxygen supplied to the oxide ferrite from the oxide target.

When sputtering with oxide targets, tiny composition deviations easily deteriorate the properties of the element. With the above-described method, the composition control becomes easier, so that the reproducibility of the element increases. This method is also suitable for other compound magnetic thin films. That is to say, according to yet another aspect of the present invention, a method for forming a magnetic compound film is provided, which includes forming the magnetic compound film by sputtering with a compound target while applying a bias voltage to a substrate including a plane on which the magnetic compound film is to be formed so as to adjust the amount of at least one selected from oxygen and nitrogen supplied to the magnetic compound film from the compound target. With this method, it is possible to obtain compound magnetic thin films of the desired stoichoimetric ratio with high reproducibility.

The present invention includes the element that can be described from two or more of the aspects. The element of the present invention can include more layers, for example, two or more non-magnetic layers and magnetic layers sandwiching the non-magnetic layers.

BRIEF DESCRIPTION OF THE DRAWINGS

FIGS. 5A–B show examples of an M-H curve and an MR curve when applying an external magnetic field in certain directions to $Fe_3O_4$ formed on an MgO (100) plane. In FIG. 5A the external magnetic field is applied from <100> axis direction, and in FIG. 5B from <110> axis direction.

FIGS. 6A–B show examples of an M-H curve and an MR curve when applying an external magnetic field in certain directions to $Fe_3O_4$ formed on an MgO (110) plane. In FIG. 6A the external magnetic field is applied from <110> axis direction, and in FIG. 6B from <001> axis direction.

FIG. 8A shows the distribution in the (100) plane, FIG. 8B in the (110) plane and FIG. 8C in the (111) plane.

DESCRIPTION OF THE PREFERRED EMBODIMENTS

The following is a description of the preferred embodiments of the present invention.

In the magnetoresistive element with improved thermal resistance provided by the first aspect of the present invention, it is desired that the thickness of the non-magnetic film is adjusted appropriately to achieve static magnetic coupling between the magnetic films. A preferable thickness of the non-magnetic film for making the static magnetic coupling significant to the antiferromagnetic coupling is at least 1.5 nm and that for making the static magnetic coupling dominant is at least 2.6 nm, although these will depend on the non-magnetic material. When the thickness of the non-magnetic film exceeds 10 nm, the magnetic coupling accordingly becomes weaker.

In this element, it is preferable that that the element area is not larger than 10 $\mu m^2$, more preferably not larger than 1 $\mu m^2$. Here, "element area" means the area in the intermediate layer that is perpendicular to the direction of the current flow, and in a vertical current-type element, the area of the film surface of the intermediate layer. If the element is made smaller to the point where this area becomes 10 $\mu m^2$ or less, then the thickness of the magnetic films becomes relatively large with respect to the area. Therefore, the demagnetizing field per magnetic layer becomes large, and the magnetostatic energy per layer becomes large. The magnetization directions of the magnetic layers tend to assume an antiparallel state in order to reduce the magnetostatic energy, so that an increase of the magnetostatic energy stabilizes the antiparallel state of the magnetization. In order to stabilize the magnetization directions even further, it is also possible to provide the contour shape of the pinned magnetic layer with anisotropy. As a favorable contour shape, it is preferable that the ratio of long axis to short axis is 2 or greater. There is no particular limitation to the contour shape, and it can be rectangular, rhombic or elliptical.

Figure 1:
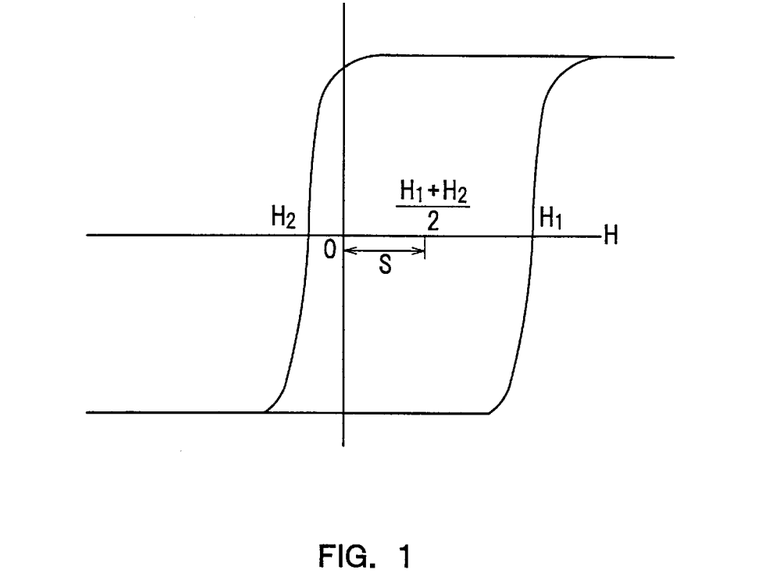
FIG. 1 is a diagram illustrating the magnetic field shift s.

If a magneto-resistive element according to the second aspect of the present invention is used, then the magnetoresistive response can be improved. More specifically, the absolute value of a magnetic field shift of the other magnetic layer (a free magnetic layer) can be decreased to not more than 50% of a coercivity of the free magnetic layer, specifically to 20 Oe or less, further to 3 Oe or less, or even to substantially 0 Oe. Here, the magnetic field shift s is defined as $$s=(H_1+H_2)/2,$$

where $H_1$ and $H_2$ are the two magnetic fields at which the magnetization is zero (M=0) in the magnetization-magnetic field curve (M-H curve) showing the relationship between magnetic field (H) and magnetization (M) (see FIG. 1).

In a magneto-resistive element, the two magnetic fields at which the resistance of the element is the average value of the maximum and the minimum in the resistance-magnetic field curve substantially correspond to $H_1$ and $H_2$, respectively.

In this element, the value of Mde/Mdo can be adjusted as appropriate to decrease the magnetic shift to the aforementioned levels. Consequently, although the value of Mde/Mdo may differ depending on the level of positive magnetic coupling in the element, it is usually preferable that the value of Mde/Mdo is about 0.5 to 0.9.

If the magnetic films are all soft magnetic layers, then the magnetization direction on the film tend to rotate easily in response to external magnetic fields. Therefore, it is preferable that at least one of the magnetic films has a high coercive force, for example at least 500 Oe (39.8 kA/m). Preferable high coercive materials are CoPt, FePt, CoCrPt, CoTaPt, FeTaPt and FeCrPt, for example.

It is also possible to stabilize the magnetizations coupled in antiparallel by using an antiferromagnetic layer. In this case, the element of the present invention further includes an antiferromagnetic layer, leading to an element in which this antiferromagnetic layer is magnetically coupled with the pinned magnetic layer. As the antiferromagnetic material, it is possible to use Cr-containing antiferromagnetic materials expressed by the composition formula $Cr_{100-x}Me_x$ (wherein Me is at least one selected from Re, Ru and Rh, and $0.1 \leq x \leq 20$, atomic ratio) as well as Mn-containing antiferromagnetic materials such as FeMn and IrMn. Preferable Mn-containing antiferromagnetic materials include noble metal-based antiferromagnetic materials expressed by the composition formula $Mn_{100-x}Me_x$ (wherein Me is at least one selected from Pd and Pt, and $40 \leq x \leq 55$).

In order to increase the crystallinity of the antiferromagnetic material, it is possible to form the antiferromagnetic layer on a primer layer having a crystal structure and/or a lattice constant similar to those of the antiferromagnetic material. For example, if the antiferromagnetic material is PtMn or PtPdMn, then NiFe or NiFeCr can be used for the primer layer.

The following is an example of a preferable embodiment of a magneto-resistive element in accordance with a third aspect of the present invention. In the case of magnetite grown epitaxially in the (110) plane on a substrate or a primer layer, changes in magnetic resistance can be detected by introducing an external magnetic field in the range of 30° to 150° in the (110) plane, taking the <100> axis direction in that plane as 0 degrees. When an external magnetic field is introduced in this manner, the magnetization responsiveness of the magnetic resistance changes increases. An oxide ferrite in which, of the crystal magnetic anisotropic energies, at least $K_1$ is negative and preferably also $K_2$ is negative is suitable for this embodiment. In the case of an oxide ferrite in which $K_1$ is positive and preferably also $K_2$ is positive, an external magnetic field in the range of 170° to 190° in the (110) plane should be introduced, taking the <100> axis direction as 0 degrees.

In the case of magnetite that has been grown epitaxially in the (100) plane, an external magnetic field in the range of 40° to 50° or 130° to 140° in the (100) plane should be introduced, taking the <100> axis direction in the (110) plane as 0 degrees. An oxide ferrite in which, of the crystal magnetic anisotropic energies, $K_1$ is negative and preferably also $K_2$ is negative is suitable for this embodiment. In the case of an oxide ferrite in which $K_1$ is positive and preferably also $K_2$ is positive, an external magnetic field in the range of 85° to 95° or 175° to 185° in the (110) plane should be introduced, taking the <100> axis direction as 0 degrees.

In the case of magnetite that has been grown epitaxially in the (111) plane, a high magnetization responsiveness is attained by detecting changes in the magnetic resistance by introducing an external magnetic field within an arbitrary angular range within that plane. Taking the <100> axis direction as 0 degrees, it is even better to introduce an external magnetic field from an angle of a range including 30°, 90° or 150° in the (111) range, preferably substantially one of the angular ranges mentioned above. These preferable embodiments share an oxide ferrite in which at least $K_2$ is negative. If at least $K_2$ is negative, then, taking the <110> axis direction as 0 degrees, it is even better to introduce an external magnetic field from an angle of a range including 0°, 60° or 120°, preferably substantially one of the angular ranges mentioned above.

For magnetite grown aligned in the (100) plane, the (110) plane or the (111) plane, and for magnetite grown without orientation, the external magnetic field should be introduced at an angle within an arbitrary range in these planes. In particular, if the average crystal width of the in-plane direction of $Fe_3O_4$ is not more than 10 nm, then the apparent crystal magnetic anisotropic energy becomes small, so that it is possible to take magnetically soft $Fe_3O_4$ or a ferromagnetic material having $Fe_3O_4$ as its principal component. This is not limited to $Fe_3O_4$, but is true for all oxide ferrites.

It has been found that the change rate of the magnetic resistance tends to grow when an element including a d-electron is included in the intermediate layer adjacent to the oxide ferrite. Elements including d-electrons are the elements with an atom number of 21 or greater in the periodic table of elements.

If a compound magnetic thin film including oxygen and/or nitrogen and a transition metal, such as oxide ferrite, is formed by sputtering with a compound magnetic target, then the oxygen or nitrogen content in the composition tends to deviate. However, if the compound magnetic thin film is formed while applying a bias voltage to the substrate or primer onto which it is formed to control the oxygen and/or nitrogen included in the thin film, then it is possible to form the compound magnetic thin film with high reproducibility. This method also can be combined with reactive sputtering using a sputtering gas including an inert gas and oxygen and/or nitrogen.

The application of a bias voltage can be accomplished by:
1. Electrically insulating (floating) the substrate from ground, and controlling the applied bias voltage with the plasma density, which is determined by the discharge power, gas pressure, etc.;
2. Electrically insulating (floating) the substrate from ground, and applying a dc or a high-frequency (RF) bias voltage with an external power source. The RF bias frequency should be in the ordinarily used range, for example 10 MHz or higher.

This method is suitable for RF sputtering, such as RF magnetron sputtering. When applied to these sputtering methods, the film formation can be performed by applying a dc or RF bias voltage to the substrate while applying an RF voltage to the compound magnetic material taken as the target. It is preferable that the supply of RF voltage to the target and the substrate is synchronized, so as to control the formation of a magnetic deterioration layer on the uppermost film surface.

This film formation method is particularly suitable for the formation of oxide magnetic thin films of oxide ferrite or the like. Generally, the oxide magnetic target has a relatively high electrical resistance, and when it is used for film formation without bias, too much oxygen tends to be supplied. In order to reduce the oxygen in the film, it is advantageous to apply a negative bias voltage, and since the electrical resistance of the film is high, the application of an RF bias voltage is preferable. It should be noted, however, that the method for manufacturing the above-described element including oxide ferrite is not limited to the above-described film forming method. For example, it is also possible to use a compound magnetic target in which the oxygen amount has been set below the stoichiometric ratio utilizing the composition deviation in ordinary sputtering. It is further possible to use the above-described target and supplement the lacking oxygen by reactive sputtering.

To increase the crystallinity of the compound magnetic thin film, the substrate temperature should be 250° C. to 700° C. Since a bias voltage is applied, radiative heating is suitable to heat the substrate.

The magneto-resistive element explained above is particularly useful for perpendicular current-type elements (CPP-GMR elements, TMR elements), in which the current flows perpendicular to the films in a multilayered film, but it is also effective for elements in which the current flows in the film plane (CIP-GMR elements).

For the intermediate layer of a TMR element, it is possible to use a semiconductor or an insulating material including at least one element selected from oxygen, nitrogen, carbon and boron. Examples of preferable materials include $SiO_2$, SiC, $Si_3N_4$, $Al_2O_3$, AlN, $Cr_2O_3$, TiC, $HfO_2$, HfN, HfC, $Ta_2O_5$, TaN, TaC, BN, $B_4C$, DLC (diamond-like carbon), $C_{60}$ and mixtures thereof.

For the intermediate layer of a GMR element, it is possible to use a semiconductor including a transition metal. It is also possible to use a conductive compound including a transition metal and at least one selected from oxygen, nitrogen and carbon. In the case of a CPP-GMR element, the element area (that is, the area of the intermediate layer through which current flows) should be not more 0.1 $\mu$m. This is because restricting the element area increases the electrical resistance of the element at the same time as its thermal resistance. It is particularly preferable to use at least one selected from V, Nb, Ta, Cr, Mo, W, Cu, Ag, Au, Ru, Rh, Ir, Re and Os for the intermediate layer. As long as the conductivity of these metals is not lost, it is also possible to use them in the form of oxides, nitrides or carbides. It is further possible to use a mixture of a transition metal X and a compound R (at least one selected from $SiO_2$, SiC, $Si_3N_4$, $Al_2O_3$, AlN, $Cr_2O_3$, $Cr_2N$, TiO, TiN, TiC, $HfO_2$, HfN, HfC, $Ta_2O_5$, TaN, TaC, BN and $B_4C$). Furthermore, sometimes it is also possible to raise the electrical resistance and the thermal resistance of the element by devising a multilayer film with at least two layers, such as X/R.

For the non-magnetic film, a non-magnetic conductive material should be used. Examples of preferable materials for a non-magnetic film through which the magnetic films are magnetostatically coupled include Ti, Zr, Hf, V, Nb, Ta, Cr, Mo, W, Al, Rh, Pt and Pd. Examples of preferable materials for a non-magnetic film through which the magnetic films are coupled by antiferromagnetic coupling include Cr, Cu, Ag, Au, Ru, Rh, Ir, Re and Os.

While the thickness of the non-magnetic film that is preferable for antiferromagnetic coupling also depends on the material, it is roughly 0.2 to 1.3 nm. If the non-magnetic material is for example Cr, then this thickness is preferably 0.8 to 1.3 nm, whereas for Ru it is preferably 0.2 to 0.5 nm or 0.6 to 1.0 nm, for Ir it is preferably 0.3 to 0.5 nm, and for Rh it is preferably 0.4 to 0.8 nm.

There is no particular limitation to the material and the thickness of the magnetic films, and it is appropriate to apply the materials and thicknesses that are used conventionally. The thickness of the magnetic film suitable for the magnetostatic coupling is 1.5 to 20 nm. The thickness less than 1.5 nm reduces lowering of magnetostatic energy while the thickness more than 20 nm may prevent leaking magnetic fields from coupling.

It is preferable that the magnetic layers are made of the following materials at least in the region within 0.5 nm from the interface with the intermediate layer:

1. Co-based amorphous materials such as CoNbZr, CoTaZr, CoFeB, CoTi, CoZr, CoNb, CoMoBZr, CoVZr, CoMoSiZr, CoMoZr, CoMoVZr and CoMnB;
2. Fe-based microcrystal materials, such as FeSiNb or Fe(Si, Al, Ta, Nb, Ti)N;
3. Materials including at least 50 wt % of a ferromagnetic element selected from Fe, Co and Ni, for example FeCo alloys, NiFe alloys, NiFeCo alloys, or ferromagnetic materials such as FeCr, FeSiAl, FeSi, FeAl, FeCoSi, FeCoAl, FeCoSiAl, FeCoTi, Fe(Ni)(Co)Pt, Fe(Ni)(Co)Pd, Fe(Ni)(Co)Rh, Fe(Ni)(Co)Ir, or Fe(Ni)(Co)Ru, or dilute magnetic alloys;
4. Nitrides such as FeN, FeTiN, FeAlN, FeSiN, FeTaN, FeCoN, FeCoTiN, FeCoAlN, FeCoSiN, and FeCoTaN;
5. $Fe_3O_4$;
6. Half-metallic materials such as XMnSb (wherein X is at least one selected from Ni, Cu and Pt), LaSrMnO, LaCaSrMnO, $CrO_2$;
7. Spinel oxides such as perovskite oxides, MnZn ferrite and NiZn ferrite; or
8. Garnet oxides.

Also possible is a ferromagnetic or ferrimagnetic material including at least 50 wt % of these materials. It should be noted that throughout this specification, the elements in parentheses are optional elements.

Figure 2:
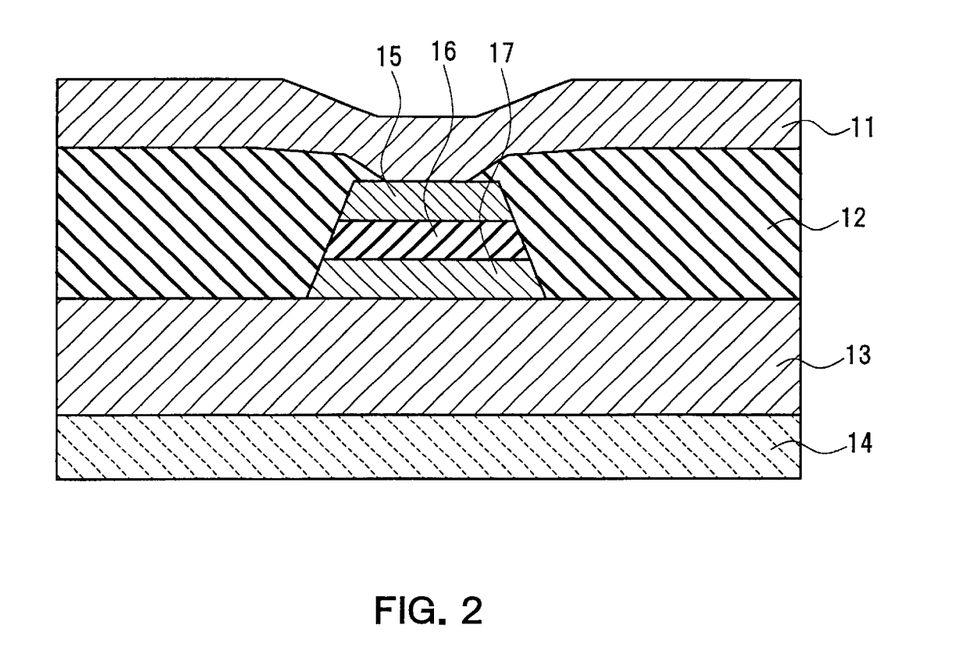
FIG. 2 is a cross sectional view of a magneto-resistive element according to one embodiment of the present invention.

FIG. 2 shows an example of the configuration of the elements provided by the present invention. In this element, a lower electrode also serving as a primer layer 13, a first magnetic layer 17, an intermediate layer 16, a second magnetic layer 15 and an upper electrode 11 are layered in that order on a substrate 14. A mesa-shaped element portion made of the magnetic layers and the intermediate layer is enclosed by an inter-layer insulating film 12. Either one of the first and second magnetic layers can serve as the free magnetic layer (or the pinned magnetic layer), and either one of the magnetic layers can include an oxide ferrite. The magnetic layers and the intermediate layer also can be multilayer films, and it is further possible to add other layers, such as an antiferromagnetic layer. The configuration of the element is not restricted to the example shown in FIG. 2.

The magnetic and other layers or films can be formed by any suitable gas-phase film forming method known in the art. Examples of suitable methods include ion beam deposition (IBD), cluster ion beam deposition, or sputtering methods, such as RF, DC, ECR (electron cyclotron resonance), helicon, ICP (inductively coupled plasma) sputtering or sputtering with opposing targets, MBE (molecular beam epitaxy), or ion plating. In addition to these PVD methods, it is also possible to use CVD (chemical vapor deposition) methods, in particular for making the inter-layer insulating film.

The intermediate layer, which is a compound such as an oxide, can be formed directly, if using chemical beam epitaxy, gas source MBE, reactive vapor deposition, reactive sputtering or the like. If the intermediate layer is formed by a method in which a plasma is generated (for example reactive sputtering), then a barrier layer should be formed beforehand on the magnetic layer, to suppress the oxidation of the exposed magnetic layer. As a barrier layer, an extremely thin layer of, for example, one to several atoms of Al, Si, Ta, Hf, Nb, V or Cr is suitable. In reactive vapor deposition, in which no plasma is generated, it is also possible to protect the magnetic layer by forming, for example, an oxide, nitride, carbide or boride layer of about one atom thickness. Instead of directly forming the intermediate layer, which is a compound, it is also possible to form an element contained in the intermediate layer (for example Al) on the magnetic layer, and form the compound (for example $Al_2O_3$) by exposing this element to an atmosphere with atoms, molecules, ions (plasma), or radicals of a reactive gas including oxygen for example, at a suitable pressure and reaction temperature, and for a suitable time. It is also possible to form an intermediate layer of the desired thickness by repeating the process of film formation and oxidation or the like.

There is no particular limitation to the method for processing the element portion into a mesa shape, and it can be performed by any process that is ordinarily used for microprocessing, for example physical or chemical etching, such as ion milling, RIE, EB, or FIB etching, or photolithography techniques. In order to make the lower electrode flat, it is also effective to process the surface by CMP or cluster ion beam etching to increase the magnetic resistance change ratio.

WORKING EXAMPLES

Working Example 1

The following samples were produced by magnetron sputtering on a thermally oxidized Si substrate.

Sample 1: Ta(3)/Cu(50)/Ta(3)/CoFe(3)/$Al_2O_3$(1)/CoFe(3)/Ru(0.8)/CoFe(3)/PtMn(20)/Ta(3)
Sample 2: Ta(3)/Cu(50)/Ta(3)/CoFe(3)/$Al_2O_3$(1)/CoFe(7)/Ta(3)
Sample 3: Ta(3)/Cu(50)/Ta(3)/CoFe(3)/$Al_2O_3$(1)/CoFe(3)/Ta(3)/CoFe(10)/Ta(3)
Sample 4: Ta(3)/Cu(50)/Ta(3)/CoFe(3)/$Al_2O_3$(1)/CoFe(3)/Ta(3)/CoPt(4.4)/Ta(3)
Sample 5: Ta(3)/Cu(50)/Ta(3)/CoFe(3)/$Al_2O_3$(1)/CoFe(3)/Ta(3)/CoFe(3)/PtMn(20)/Ta(3)
Sample 6: Ta(3)/Cu(50)/Ta(3)/CoFe(3)/Cu(2.2)/CoFe(3)/Ta(3)/CoFe(3)/PtMn(20)/Ta(3)

The numbers in parentheses denote the film thicknesses (in nm; this is also true in the following). Here, Ta(3)/Cu(50)/Ta(3) serves as a lower electrode and primer layer, CoFe(3)/Ru(0.8)/CoFe(3)/PtMn(20)/Ta(3) is a pinned layer with layered ferrimagnetic structure, CoFe(3)/Ta(3)/CoPt(4.4), CoFe(3)/Ta(3)/CoFe(3) and CoFe(3)/Ta(3)/CoFe(10) are pinned magnetic layers using magnetostatic coupling, $Al_2O_3$ and Cu are intermediate layers, and the rest are free magnetic layers (except the outermost layer of Ta(3), which is a protective film). The coercive force of the CoPt(4.4) is 500 Oe.

After forming these films, a thermal process is performed for 1.5 hours at 400° C. in a magnetic field of 5 kOe (398 kA/m). Next, using steppers, the element area, which is the area through which the current flows in the intermediate layer, is micro-processed to a mesa shape of 0.1 to 20 $\mu m^2$ with an aspect ratio of 4:1. Subsequently, the inter-layer insulating film and the upper electrode were formed, yielding a vertical current-type magneto-resistive element. It should be noted that the longitudinal direction of the element was set to the direction in which the magnetic field was applied during thermal processing.

Table 1 shows the magnetic resistance change ratio (MR value) measured by applying an external magnetic field of ±1000 Oe (79.6 kA/m) in the longitudinal direction of the resulting elements.

TABLE 1

| Sample No. | element area ($\mu m^2$) | | | | |
| --- | --- | --- | --- | --- | --- |
|  | 0.1 | 0.5 | 2 | 10 | 20 |
| 1 | 16 | 17 | 18 | 19 | 20 |
| 2 | 25 | 21 | 18 | 15 | 12 |
| 3 | 35 | 31 | 23 | 20 | 17 |
| 4 | 36 | 35 | 29 | 27 | 26 |
| 5 | 40 | 39 | 34 | 32 | 29 |
| 6 | 27 | 25 | 22 | 20 | 13 |

(MR value: %)

Compared to Sample 1, which includes a layered ferrimagnetic structure, and Sample 2, which uses a coercive force difference due to shape anisotropies, it can be seen that at element areas of 10 $\mu m^2$ or less, Samples 3 to 6 had higher MR values. It seems that the MR values of Samples 3 to 6 are higher than that of Sample 2, because the influence of the magnetic field leaking into the free magnetic layer is decreased by the magnetostatic coupling. In Samples 4 and 5, an antiferromagnetic material or a high coercivity material is used, so that there is only a small dependency of the MR value on the element area. Sample 6, which uses Cu for the intermediate layer, includes an antiferromagnetic material, but as the element area becomes smaller, the current per area effectively increases, so that the dependency on the element area is large.

Then, the MR value when changing the film thickness X of the Ta of the non-magnetic film was examined for with the following film configuration. Table 2 shows the results. The conditions under which these elements were prepared were similar to the above, including the parameters for the thermal processing, and the element aspect ratio was also 4:1. The element area was set to 0.1 $\mu m^2$.

Sample 7: Ta(3)/Cu(50)/Ta(3)/CoFe(3)/$Al_2O_3$(1)/CoFe(3)/Ta(X)/CoFe(3)/PtMn(20)/Ta(3)

TABLE 2

| Ta film thickness (nm) | MR(%) |
| --- | --- |
| 1 | 20 |
| 1.5 | 35 |
| 3 | 40 |
| 5 | 41 |
| 10 | 35 |
| 20 | 25 |

High MR values are attained when the film thickness of the non-magnetic film is in a range in which the magnetostatic coupling is dominant (preferably about 2.6 to 10 nm). As a result of similar experiments, it was found that a preferable thickness for the magnetic layers is in the range of 1.5 to 20 nm. Furthermore, a similar tendency is also observed in similar experiments with the ferromagnetic materials, non-magnetic materials and high coercivity materials (antiferromagnetic materials) mentioned above.

Working Example 2

An element having the following film configuration was produced on a thermally oxidized Si substrate.

Ta(3)/Cu(500)/Ta(3)/CoFe(3)/Ru(0.7)/CoFe(3)/Al$_2$O$_3$/CoFe(3)/NiFe(4)/Ta(3)

Figure 3:
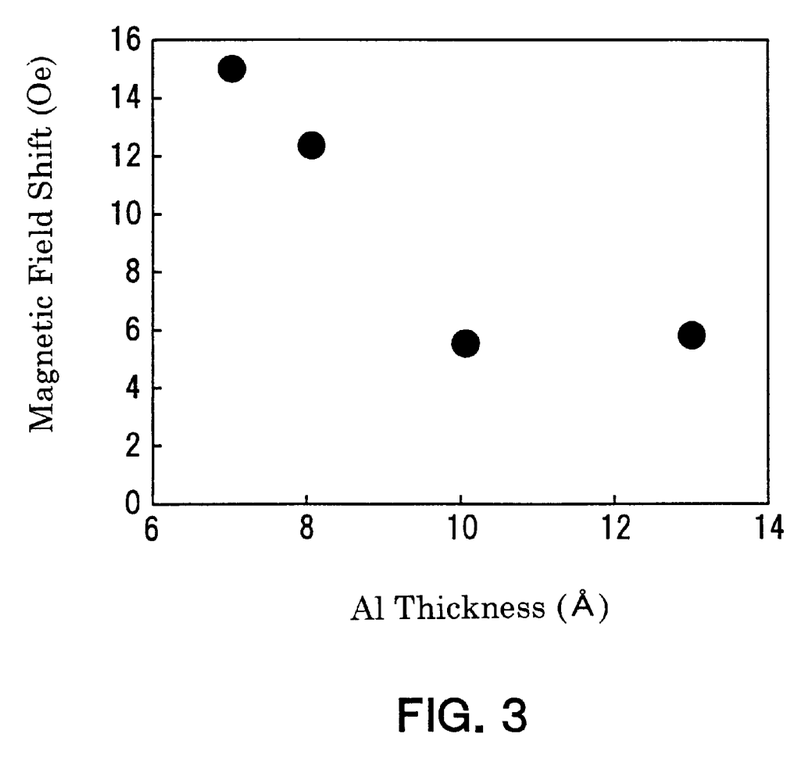
FIG. 3 is a diagram illustrating a relationship between the Al thickness for the intermediate film and the magnetic shift.

Changing the film thickness of the Al that is applied for forming the Al$_2$O$_3$ layer, the respective M-H curves were measured to determine the magnetic field shifts. The results are shown in FIG. 3. As the film thickness of the Al becomes thinner, the magnetic field shifts increase. The reason for this is not entirely clear, but it seems that as the Al$_2$O$_3$ layer becomes thinner, orange peel coupling between the free magnetic layer and the pinned magnetic layer causes positive magnetic coupling between the two magnetic layers.

Next, setting the Al film thickness to 0.7 nm, elements having the following film configuration were produced.

| | |
|---|---|
| Sample 11: | Ta(3)/Cu(500)/Ta(3)/CoFe(3)/Ru(0.7)/CoFe(5)/Al$_2$O$_3$/CoFe(3)/NiFe(4)/Ta(3) |
| Sample 12: | Ta(3)/Cu(500)/Ta(3)/CoFe(3)/Ru(0.7)/CoFe(3)/Al$_2$O$_3$/CoFe(3)/NiFe(4)/Ta(3) |

When the M-H curves of these two elements were measured, it was found that the magnetic field shift was suppressed in Sample 11, but tended to increase in Sample 12. When the multilayer film in Sample 11 was processed into a mesa shape and the MR value was measured, an MR value of 30% was obtained at an RA (normalized bonding resistance) of 15 $\Omega\mu m^2$. The magnetic field shift was suppressed to substantially 0 Oe.

Thus, especially when the film thickness of the intermediate layer is thin, magnetic field shifts are suppressed when the product of film thickness and saturation magnetization of the magnetic films on the side of the intermediate layer is large. As a result of even more detailed experimentation, it was found that when Mde/Mdo is more than 0.5 and less than 1, a magneto-resistive element with little magnetic shift can be obtained.

Working Example 3

Figure 4A:
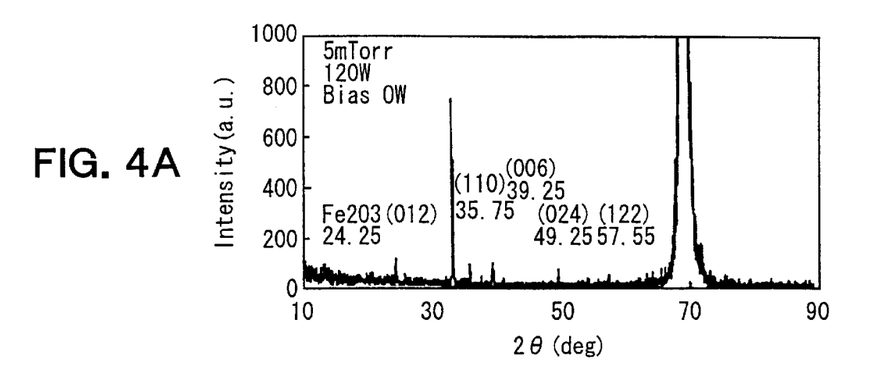
FIGS. 4A–C are X-ray analysis charts illustrating the differences of the crystal structure of the Fe oxide obtained depending on the bias on the substrate, namely at 0 W (FIG. 4A), at 5 W (FIG. 4B), and at 10 W (FIG. 4C).
Figure 4B:
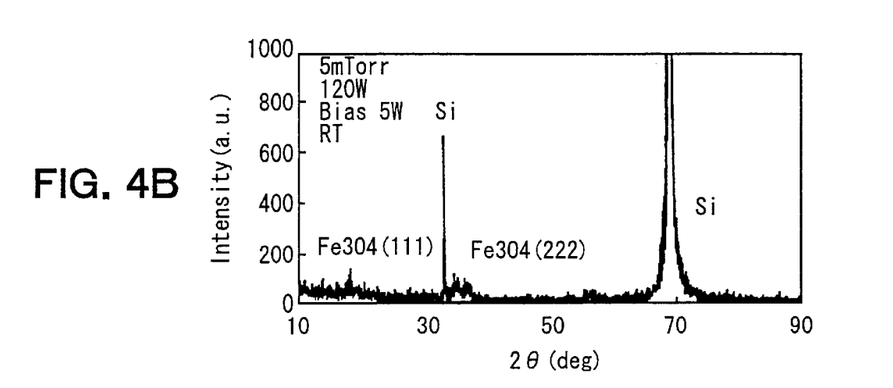
Figure 4C:
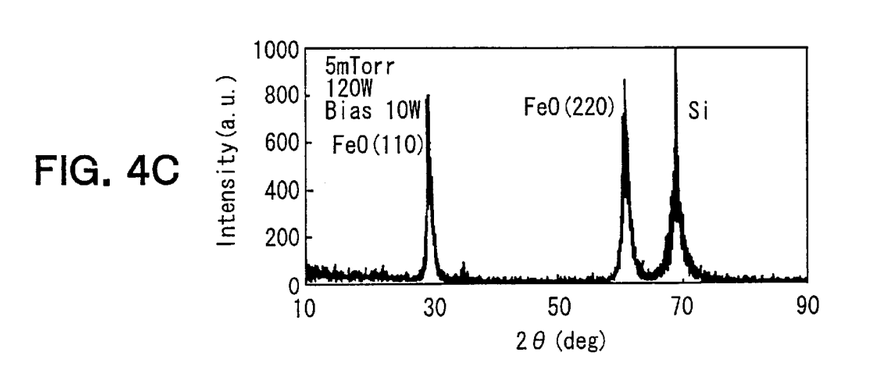

Using an Fe$_3$O$_4$ target, an Fe oxide film was produced by RF magnetron sputtering at room temperature on a thermally oxidized Si substrate. During the film formation, an RF bias of 0, 5 or 10 W was applied. FIGS. 4A to 4C show the results of the X-ray analysis of the resulting Fe oxide films. Fe$_2$O$_3$ was formed at an RF bias of 0 W, Fe$_3$O$_4$ was formed at 5 W, and FeO was formed at 10 W. Thus, as the bias increased, the amount of oxygen decreased. Observing the (111) plane parallel to the substrate surface, it could be confirmed that the Fe$_3$O$_4$ oriented itself in the (111) plane. Moreover, from measuring the M-H curve, it was found that the Fe$_3$O$_4$ was not oriented inside the film surface. Forming Fe$_3$O$_4$ at different substrate temperatures, it was found that it is easy to form Fe$_3$O$_4$ with high crystallinity in a substrate temperature range of 250° C. to 700° C.

Setting the substrate temperature to 300° C. and forming a Pt film of 300 nm film thickness on the thermally oxidized Si substrate, an Fe$_3$O$_4$ film of 50 nm film thickness was formed at a bias of 5 W. Then, after returning the substrate temperature to room temperature, an Al$_2$O$_3$ film was formed, and a CoFe film of 20 nm film thickness was layered on top of that. The MR value of this multilayer film was measured to be about 3%. This value was constant, regardless of the direction of the applied magnetic field.

Figure 5A:
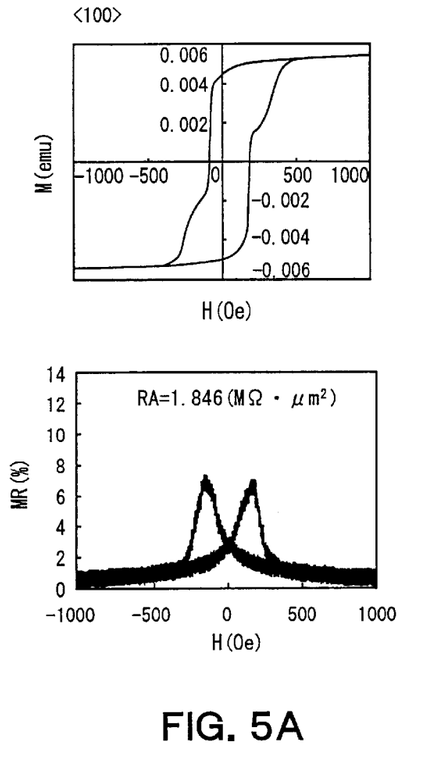
Figure 5B:
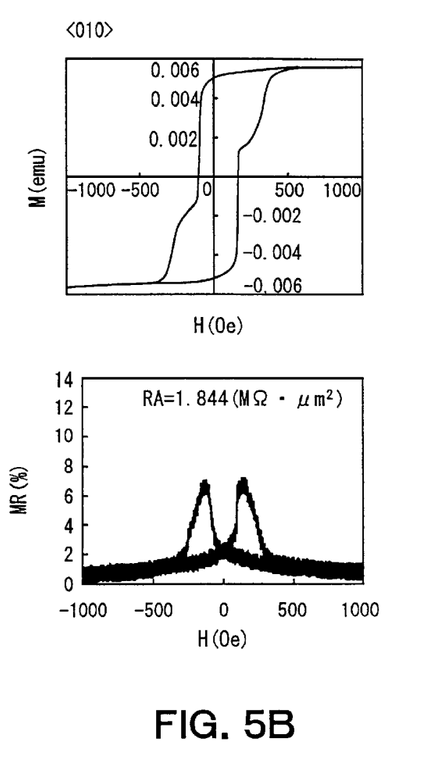
Figure 6A:
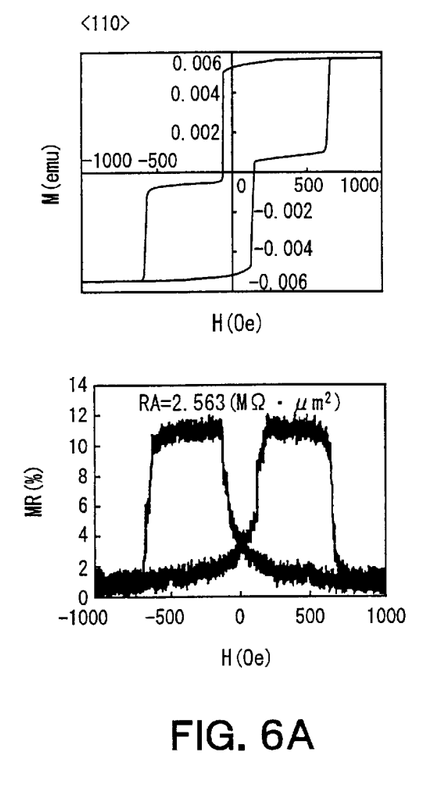
Figure 6B:
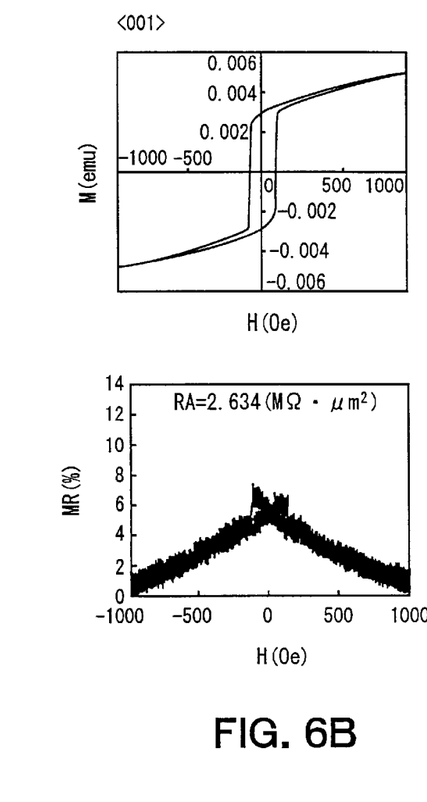
Figure 7A:
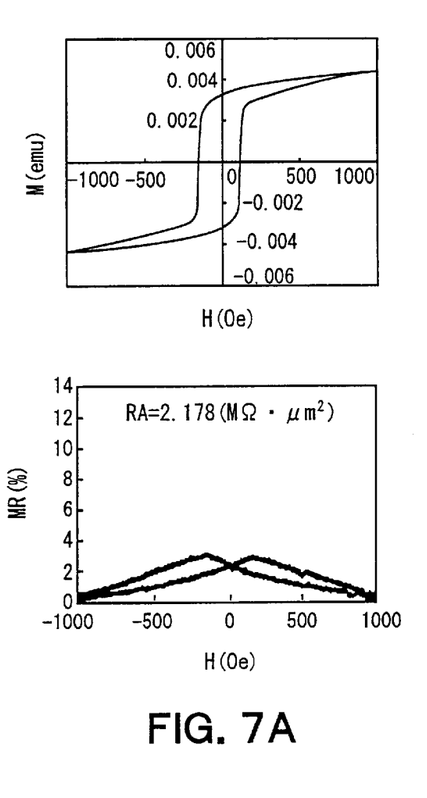
FIGS. 7A–B show examples of an M-H curve and an MR curve when applying an external magnetic field in arbitrary direction to $Fe_3O_4$ formed on an MgO (111) plane.
Figure 7B:
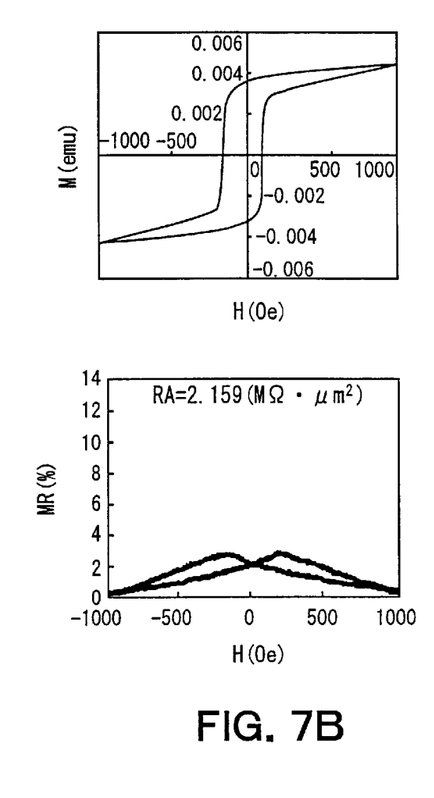

Multilayer films were formed, as described above, on the (100), (110) and (111) planes of an MgO substrate. The M-H curves of the multilayer films and the MR curves after microprocessing them are shown in FIGS. 5 to 7. FIGS. 5A to 5B show the results when applying an external magnetic field in <100> or <010> axis direction in the (100) plane, FIGS. 6A to 6B show the results when applying an external magnetic field in <110> or <001> axis direction in the (110) plane, and FIGS. 7A to 7B show the results when applying an external magnetic field of arbitrary orientation in the (111) plane.

Figure 8A:
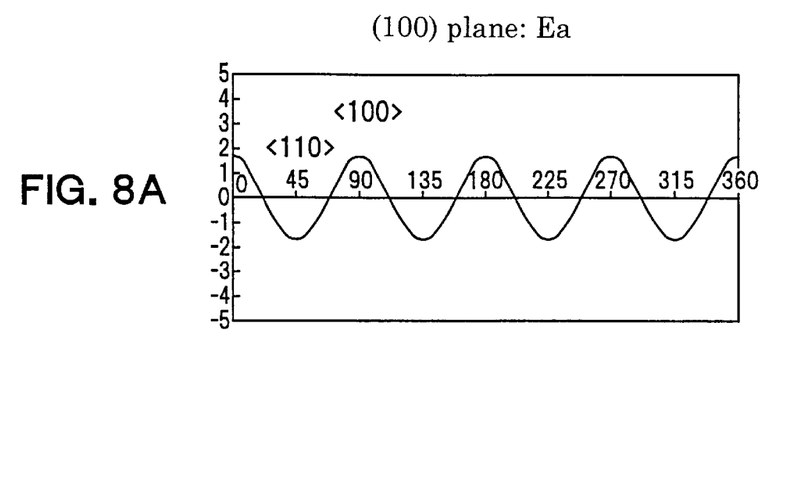
FIGS. 8A–C show anisotropic energy distributions in various $Fe_3O_4$ planes.
Figure 8B:
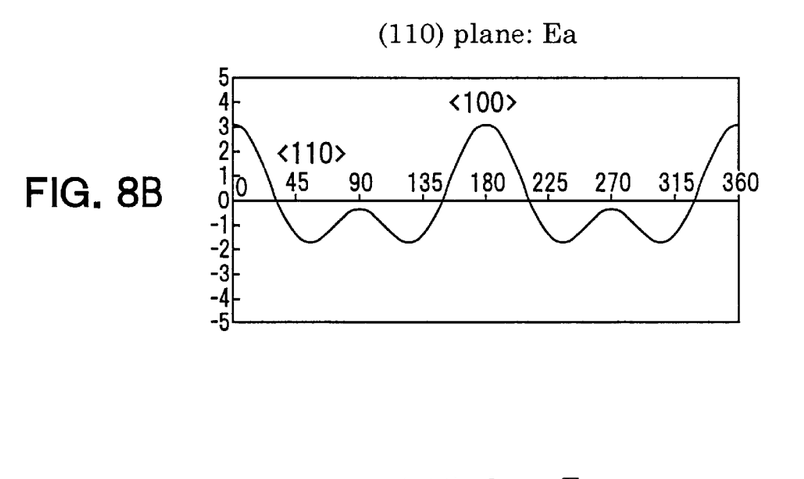
Figure 8C:
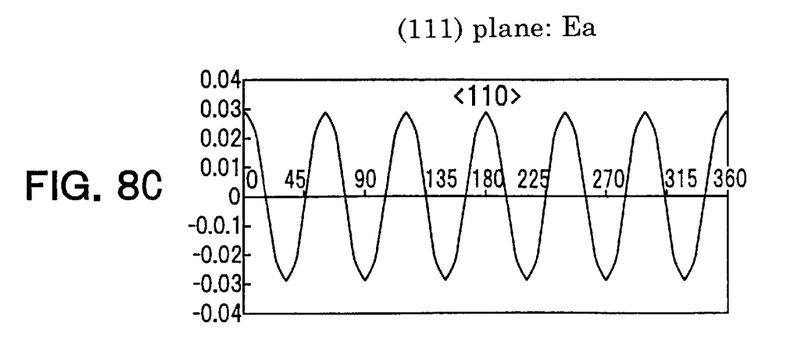

The highest MR was obtained when applying an external magnetic field in <110> axis direction in the (110) plane. This result suggests that the highest MR is attained when applying an external magnetic field in the direction regarded as the axis of easy magnetization, as can be seen from the anisotropic energy distribution charts (FIGS. 8A to 8C) of the films. When using for a device a material that has a relatively large crystal magnetic anisotropy while having a high spin polarization, such as Fe$_3$O$_4$, then the material does not undergo magnetic saturation in practical magnetic field ranges when using the axis of hard magnetization. Therefore, it becomes difficult to attain a high MR.

Moreover, as shown by experimentation as described above, the MR is further improved when using an intermediate layer containing elements with d electrons (such as Ta) in the portion adjacent to the oxide ferrite.

With the present invention, thermal resistance is improved by introducing magnetostatic coupling into the pinned magnetic layer of the magnetoresistive element. Moreover, with the present invention, magnetic field shifts are reduced by generating negative coupling in the magnetic layers of the pinned magnetic layer of the magnetoresistive element. Furthermore, with the present invention, a magnetoresistive element with high MR can be provided by specifying the direction in which an external magnetic field is applied to the oxide ferrite. And, with the present invention, compound magnetic thin films with excellent properties, such as oxide ferrite films, can be formed with high reproducibility by adjusting the amount of oxygen or the like by applying a bias voltage to the substrate.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A magnetoresistive element, comprising:
   an intermediate layer; and
   a pair of magnetic layers sandwiching the intermediate layer;
   wherein one of the magnetic layers is a pinned magnetic layer in which magnetization rotation with respect to an external magnetic field is harder than in the other magnetic layer;
   wherein the pinned magnetic layer includes at least one non-magnetic film and magnetic films sandwiching the non-magnetic film;
   wherein the magnetic films are magnetostatically coupled to one another via the non-magnetic film; and
   wherein an element area, which is the area of the intermediate layer in a plane perpendicular to the direction in which current flows, is not more than 10 $\mu m^2$.

2. The magneto-resistive element according to claim 1, further comprising an antiferromagnetic layer, which is magnetically coupled with the pinned magnetic layer.

3. The magneto-resistive element according to claim 1, wherein the intermediate layer is made of a semiconductor or an insulator and includes at least one element selected from oxygen, nitrogen, carbon and boron.

4. The magneto-resistive element according to claim 1, wherein the intermediate layer is made of a conductive material including a transition metal.

5. The magneto-resistive element according to claim 4, wherein the element area, which is the area of the intermediate layer in a plane perpendicular to the direction in which current flows, is not larger than 0.1 $\mu m^2$.

6. A magnetoresistive element, comprising:
an intermediate layer; and
a pair of magnetic layers sandwiching the intermediate layer;
wherein one of the magnetic layers is a pinned magnetic layer in which magnetization rotation with respect to an external magnetic field is harder than in the other magnetic layer;
wherein the pinned magnetic layer includes at least one non-magnetic film and magnetic films sandwiching the non-magnetic film;
wherein the magnetic films are magnetostatically coupled to one another via the non-magnetic film; and
wherein at least one of the magnetic films has a coercivity of at least 500 Oe.

7. The magneto-resistive element according to claim 6, further comprising an antiferromagnetic layer, which is magnetically coupled with the pinned magnetic layer.

8. The magneto-resistive element according to claim 6, wherein the intermediate layer is made of a semiconductor or an insulator and includes at least one element selected from oxygen, nitrogen, carbon and boron.

9. The magneto-resistive element according to claim 6, wherein the intermediate layer is made of a conductive material including a transition metal.

10. The magneto-resistive element according to claim 9, wherein the element area, which is the area of the intermediate layer in a plane perpendicular to the direction in which current flows, is not larger than 0.1 $\mu m^2$.

11. A magnetoresistive element, comprising:
an intermediate layer; and
a pair of magnetic layers sandwiching the intermediate layer;
wherein one of the magnetic layers is a pinned magnetic layer in which magnetization rotation with respect to an external magnetic field is harder than in the other magnetic layer;
wherein the pinned magnetic layer includes at least one non-magnetic film and magnetic films sandwiching the non-magnetic film;
wherein the magnetic films are coupled to one another by magnetostatic or antiferromagnetic coupling via the non-magnetic film; and
when the magnetic films are magnetic films that are arranged at positions m (with m being an integer of 1 or greater) from the intermediate layer, Mm is an average saturation magnetization of the magnetic films m and dm is their respective average film thickness, Mdo is the sum of the products Mm×dm of the magnetic films with odd m and Mde is the sum of the products Mm×dm of the magnetic films with even m, then 0.5<Mde/Mdo<1.

12. The magneto-resistive element according to claim 11, wherein an absolute value of a magnetic field shift of said other magnetic layer that is a free magnetic layer is not more than 50% of a coercivity of the free magnetic layer, where the magnetic field shift is given by the equation $s=(H_1+H_2)/2$, wherein $H_1$ and $H_2$ (with $H_1>H_2$) are two magnetic fields at which magnetization becomes zero (M=0) in a magnetization-magnetic field curve (M-H curve) showing the relationship between magnetic field (H) and magnetization (M).

13. The magneto-resistive element according to claim 11, wherein at least one of the magnetic films has a coercivity of at least 500 Oe.

14. The magneto-resistive element according to claim 11, further comprising an antiferromagnetic layer, which is magnetically coupled with the pinned magnetic layer.

15. The magneto-resistive element according to claim 11, wherein the intermediate layer is made of a semiconductor or an insulator and includes at least one element selected from oxygen, nitrogen, carbon and boron.

16. The magneto-resistive element according to claim 11, wherein the intermediate layer is made of a conductive material including a transition metal.

17. The magneto-resistive element according to claim 16, wherein the element area, which is the area of the intermediate layer in a plane perpendicular to the direction in which current flows, is not larger than 0.1 $\mu m^2$.

18. A magnetoresistive element, comprising:
an intermediate layer; and
a pair of magnetic layers sandwiching the intermediate layer;
wherein at least one of the magnetic layers includes an oxide ferrite having a plane orientation with a (100), (110) or (111) plane; and
wherein a change in electric resistance is detected by introducing an external magnetic field in said plane.

19. The magneto-resistive element according to claim 18, wherein the external magnetic field is introduced in a direction of the axis of easy magnetization in said plane.

20. The magneto-resistive element according to claim 19, wherein the oxide ferrite is oriented in the (110) plane, and, taking the direction of the <100> axis in that plane as 0°, the external magnetic field is introduced at an angle in a range of at least 30° and at most 150° in that (110) plane.

21. The magneto-resistive element according to claim 19, wherein the oxide ferrite is oriented in the (100) plane, and, taking the direction of the <100> axis in that plane as 0°, the external magnetic field is introduced at an angle in a range of at least 40° and at most 50° or at least 130° and at most 140° in that (100) plane.

22. The magneto-resistive element according to claim 19, wherein the oxide ferrite is aligned in the (111) plane and the external magnetic field is introduced in that (111) plane.

23. The magneto-resistive element according to claim 18, wherein the oxide ferrite is non-orientated in said plane.

24. The magneto-resistive element according to claim 18, wherein the oxide ferrite is magnetite.

25. The magneto-resistive element according to claim 18, wherein the intermediate layer is made of a semiconductor or an insulator and includes at least one element selected from oxygen, nitrogen, carbon and boron.

26. The magneto-resistive element according to claim 18, wherein the intermediate layer is made of a conductive material including a transition metal.

27. The magneto-resistive element according to claim 26, wherein the element area, which is the area of the intermediate layer in a plane perpendicular to the direction in which current flows, is not larger than 0.1 $\mu m^2$.

* * * * *

UNITED STATES PATENT AND TRADEMARK OFFICE
CERTIFICATE OF CORRECTION

PATENT NO. : 6,680,831 B2
DATED : January 20, 2004
INVENTOR(S) : Hiramoto et al.

It is certified that error appears in the above-identified patent and that said Letters Patent is hereby corrected as shown below:

Title page,
Item [56], References Cited, U.S. PATENT DOCUMENTS, insert:

-- 6,074,707    06/2000    Nakazawa et al.
6,359,760    03/2002    Kanno
6,340,533    01/2002    Ueno et al. --

FOREIGN DOCUMENTS, insert:

-- JP    10-223942    08/1998
JP    2000-22236    01/2000
JP    2000-91667    03/2000
KR    1998-71112    10/1998 --

Column 14,
Line 39, "magneto-resistive clement" should read -- magneto-resistive element --

Signed and Sealed this

Twenty-eighth Day of September, 2004

JON W. DUDAS
*Director of the United States Patent and Trademark Office*